United States Patent [19]

Kaifler et al.

[11] Patent Number: 5,065,114
[45] Date of Patent: Nov. 12, 1991

[54] CIRCUIT CONFIGURATION FOR AN AMPLIFIER STAGE

[75] Inventors: Erich Kaifler, Taufkirchen; Horst Grobecker, Munich, both of Fed. Rep. of Germany

[73] Assignee: Siemens Aktiengesellschaft, Munich, Fed. Rep. of Germany

[21] Appl. No.: 482,537

[22] Filed: Feb. 21, 1990

[30] Foreign Application Priority Data

Feb. 22, 1989 [EP] European Pat. Off. ........... 89103063

[51] Int. Cl.$^5$ .............................................. H03F 3/16
[52] U.S. Cl. ................................... 330/277; 330/300; 358/184
[58] Field of Search ...................... 330/156, 277, 300; 358/184

[56] References Cited

U.S. PATENT DOCUMENTS 4,093,925 6/1978 Yokoyama .......................... 330/277

OTHER PUBLICATIONS

Clifton, "MOSFETs Part 2-Circuits You Can Build and Use", Radio-Electronics, Dec. 1969, pp. 61-63, 68.

Primary Examiner—James B. Mullins
Attorney, Agent, or Firm—Herbert L. Lerner; Laurence A. Greenberg

[57] ABSTRACT

A circuit configuration for an amplifier stage includes an input terminal for receiving an input signal, an output terminal to be connected to a capacitive load, a supply voltage terminal for connection to a direct voltage and at least one reference potential terminal to be connected to the capacitive load. An amplifier quadrupole for amplifying the input signal has a first output lead, a first input lead connected to the input terminal, a second input lead connected to the at least one reference potential terminal, and a second output lead connected to the at least one reference potential terminal. At least one self-conducting FET for accelerated charging of the capacitive load has a gate lead connected to the first output terminal, a drain lead connected to the supply voltage terminal, and a source lead connected to the output terminal. At least one ohmic resistor is connected between the first output lead and the supply voltage terminal. At least one other ohmic resistor is connected between the gate lead and the source lead of the at least one self-conducting FET.

10 Claims, 2 Drawing Sheets

CIRCUIT CONFIGURATION FOR AN AMPLIFIER STAGE

The invention relates to a circuit configuration for an amplifier stage, including an input terminal for receiving an input signal, an output terminal, a supply voltage terminal for connection to a direct voltage, at least one reference potential terminal, a capacitive load to be connected between the output terminal and the reference potential terminal, an amplifier quadrupole for amplifying the input signal, the amplifier quadrupole having a first output lead, a first input lead connected to the input terminal, a second input lead connected to the reference potential terminal, and a second output lead connected to the reference potential terminal, at least one transistor connected between the first output lead and the output terminal for accelerated charging of the capacitive load, and at least one ohmic resistor connected between the first output lead and the supply voltage terminal.

A circuit configuration of the type described above is known from and shown in the book "Halbleiter-Schaltungstechnik"] [Semiconductor Circuitry] by U. Tietze and C. Schenk, 5th edition, 1980, at page 131, FIG. 8.6, and is described more fully below. Such a circuit is especially suitable as a video end stage for triggering a picture tube having a line frequency of 16 kHz. It has been found, however, that such a prior art circuit configuration is not satisfactory for the amplification of wide-band input signals.

A circuit configuration for a video amplifier end stage for triggering a picture tube having a 32 kHz line frequency is also known and discussed more fully below.

It is accordingly an object of the invention to provide a circuit configuration for a wide-band amplifier stage, particularly for use as a video end stage, which overcomes the hereinafore-mentioned disadvantages of the heretoforeknown devices of this general type, which can be made in a simple manner using few components and which is uncritical in terms of switching times, even at relatively high-frequency input signals.

With the foregoing and other objects in view there is provided, in accordance with the invention, a circuit configuration for an amplifier stage comprising an input terminal for receiving an input signal; an output terminal to be connected to a capacitive load; a supply voltage terminal for connection to a direct voltage; at least one reference potential terminal to be connected to the capacitive load; an amplifier quadrupole for amplifying the input signal having a first output lead, a first input lead connected to the input terminal, a second input lead connected to the at least one reference potential terminal, and a second output lead connected to the at least one reference potential terminal; at least one self-conducting FET for accelerated charging of the capacitive load having a gate lead connected to the first output terminal, a drain lead connected to the supply voltage terminal, and a source lead connected to the output terminal; at least one ohmic resistor connected between the first output lead and the supply voltage terminal; and at least one other ohmic resistor connected between the gate lead and the source lead of the at least one self-conducting FET.

In accordance with another feature of the invention, the at least one self-conducting FET is a depletion MOSFET.

In accordance with a further feature of the invention, the amplifier quadrupole has a current-dependent voltage feedback.

In accordance with an added feature of the invention, the amplifier quadrupole has at least one amplifying transistor with a control path connected between the input leads and a load path connected between the output leads.

In accordance with an additional feature of the invention, the at least one amplifying transistor is a bipolar transistor.

In accordance with yet another feature of the invention, the at least one amplifying transistor is an enhancement MOSFET.

In accordance with yet a further feature of the invention, the at least one amplifying transistor is an IGBT.

In accordance with yet an added feature of the invention, the circuit configuration is a video amplifier end stage, and the capacitive load is a picture tube of the video amplifier end stage.

In accordance with yet an additional feature of the invention, a picture is triggerable with a video signal having a line frequency of 16 kHz.

In accordance with a concomitant feature of the invention, a picture is triggerable with a video signal having a line frequency of 32 kHz.

Other features which are considered as characteristic for the invention are set forth in the appended claims.

Although the invention is illustrated and described herein as embodied in a circuit configuration for an amplifier stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
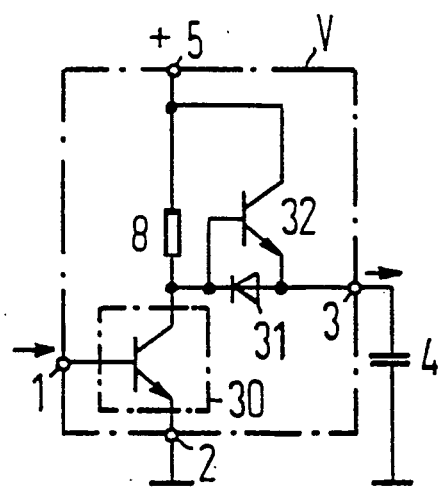
FIG. 1 is schematic circuit diagram of a prior art circuit configuration of a known amplifier stage with an active load.

Referring now to the figures of the drawing in detail and first, particularly, to FIG. 1 thereof, there is seen a prior art circuit configuration of the kind shown in FIG. 8.6 on page 131 of the book entitled "Halbleiter-Schaltungstechnik"] [Semiconductor Circuitry] by U. Tietze and CH. Schenk, 5th edition, 1980. The circuit configuration has an amplifier quadrupole that amplifies an input signal and is in the form of a bipolar transistor 30 in an emitter circuit. The emitter lead of the bipolar transistor 30 is connected to a reference potential terminal 2 and the collector lead thereof is connected through a resistor 8 to a supply voltage terminal 5. The base lead of the bipolar transistor 30 is connected to an input terminal 1 of the amplifier stage V. The cathode lead of a diode 31 and the base lead of a further bipolar transistor 32 are also connected to the connecting point of the resistor 8 and the collector lead of the bipolar transistor 30. The collector lead of the further bipolar transistor 32 is in contact with the supply voltage source terminal 5, while the emitter lead of the further bipolar transistor 32 and the anode lead of the diode 3! are connected to the output terminal 3 of the amplifier stage V. A capacitive load 4, such as the picture tube of a video display unit, is connected between reference potential and the output terminal 3.

With the circuit configuration shown in FIG. 1, which is also known as an "active load circuit", the capacitive load 4 can be charged in an accelerated fashion. This is accomplished in particular due to the fact that with negatively oriented pulses at the input terminal 1, which lead to positively oriented pulses at the output terminal 3, the first bipolar transistor 30 blocks, causing its collector potential to rise. This blocks the diode 31, so that the emitter potential of the further bipolar transistor 32 is initially maintained, while at the same time its base potential is increased. This increases the base current in the further bipolar transistor 32 and thus brings about a collector current that is increased by the current amplification factor and leads to an accelerated charging of the capacitive load 4. The circuit of FIG. 1 is particularly suitable as a video end stage for triggering a picture tube having a line frequency of 16 kHz. However, it has been found that this known circuit configuration is no longer satisfactory for the amplification of wide-band input signals.

Figure 2:
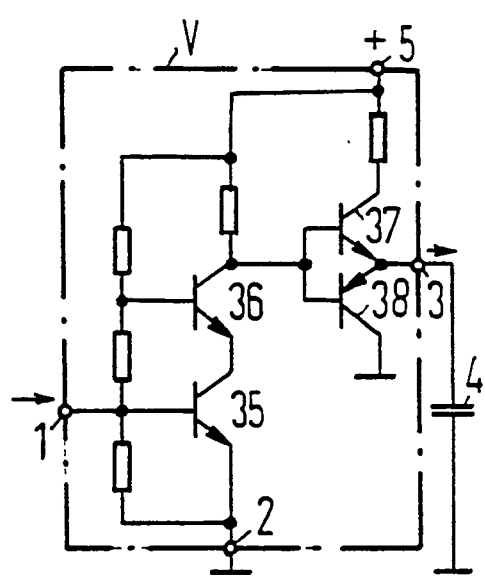
FIG. 2 is a circuit diagram of a prior art circuit configuration of an amplifier stage with a cascode circuit and a complementary emitter follower connected to the output side.

A circuit configuration for a video amplifier end stage for triggering a picture tube having a 32 kHz line frequency is shown in FIG. 2. That circuit configuration is substantially formed of a cascode circuit with two bipolar transistors 35, 36. A complementary emitter follower being formed of two further bipolar transistors 37, 38 is connected to the output of the circuit formed of the transistors 35, 36. The capacitive load 4 of the picture tube is connected between the reference potential and the output of the complementary emitter follower circuit. In order to process high-frequency input signals, it is also advantageous to supplement the circuit configuration shown in FIG. 2 with so-called acceleration networks. This can be done, for instance, by placing an RC network between the emitter lead of the input transistor 35 of the cascode circuit and the reference potential, or by placing an LC network between the collector lead of the output transistor 36 of the cascode circuit and the positive pole of the direct voltage source.

Figure 3:
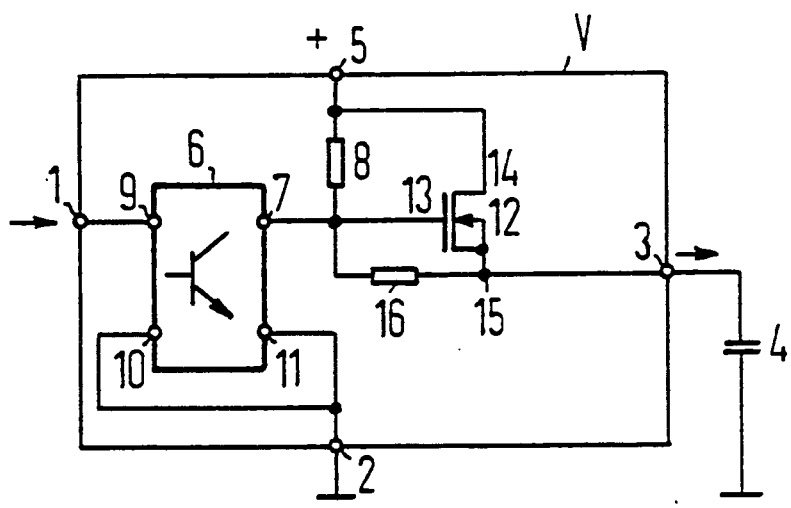
FIG. 3 is a fundamental circuit diagram of the circuit configuration according to the invention.

In FIG. 3, the fundamental circuit diagram of the circuit configuration according to the invention is shown. In addition to an input terminal 1 for applying an input signal, the amplifier stage V also has an output terminal 3, a supply voltage terminal 5 for connection to a direct voltage, and a reference potential terminal 2. A capacitive load 4, such as the picture tube of a video display unit, is connected between the reference potential terminal 2 and the output terminal 3. The capacitive load 4 is charged or discharged as a function of the input signal present at the input terminal 1.

Specifically, the amplifier stage V has an amplifier quadrupole 6 amplifying the input signal for this purpose. The amplifier quadrupole 6 is provided with a first input lead 9, a second input lead 10, a first output lead 7 and a second output lead 11. The first input lead 9 of the amplifier quadrupole is connected to the input terminal 1 of the amplifier stage V to which the input signal is applied. The second input lead 10 and the second output lead 11 of the amplifier quadrupole 6 are connected to the reference potential terminal 2. A first ohmic resistor 8 is disposed between the supply voltage terminal 5, to which the positive pole of a direct voltage source is to be connected, and the first output lead 7 of the amplifier quadrupole 6. A further transistor 12, which according to the present invention is a self-conducting n-channel FET, has a gate lead 13 connected to the first output lead 7 of the amplifier quadrupole 6, a drain lead 14 connected to the supply voltage terminal 5, and a source lead 15 connected to the output terminal 3 of the amplifier stage V. A second ohmic resistor 16 is connected between the gate lead 13 and the source lead 15 of the self-conducting FET 12.

In order to set the operating point of the amplifier quadrupole 6, it is suitable to provide the quadrupole with a current-dependent voltage feedback. With the circuit configuration according to the invention shown in FIG. 3, it is possible to rapidly re-charge the capacitive load 4 which, in the case of the connection of a picture tube of a video display unit, is on the order of magnitude of 10 pF. Above all, a further advantage is the better temperature behavior of the circuit configuration according to the invention. By using a self-conducting FET and in particular a depletion MOSFET, or a vertical depletion MOSFET, the resistor 8 can be made substantially more highly resistant than is the case in the circuit configuration of FIG. 1. This effectively reduces the power loss in the amplifier stage 6.

Figure 4:
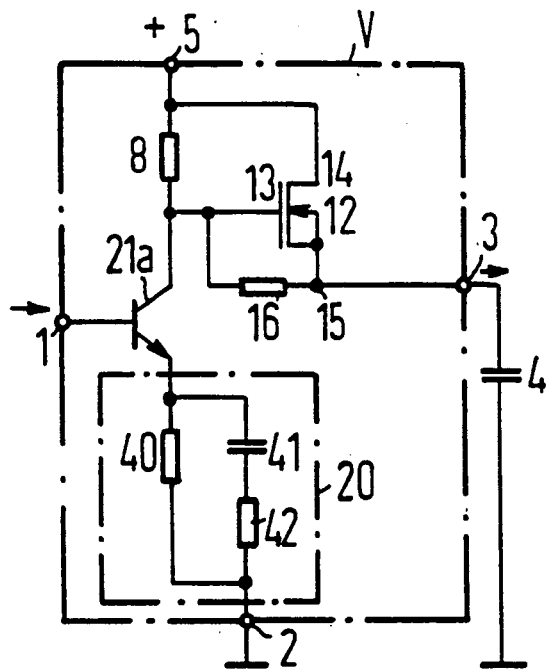
FIG. 4 is a circuit diagram of a configuration of an amplifier stage having a bipolar transistor, according to the invention.

FIG. 4 shows a circuit configuration according to the invention that results if a bipolar transistor 21a with currentdependent voltage feedback is used as the amplifier quadrupole 6. To this end, the base lead of the bipolar transistor 21a is connected to the input terminal 1 of the circuit configuration, and the collector lead thereof is connected to the connecting point of the resistors 8 and 16. The emitter lead of the bipolar transistor 21a is connected to the reference potential terminal 2 through an RC network 20 used for current-dependent voltage feedback. The RC network 20 may be formed, for instance, of a resistor 40 connected in parallel with a series circuit formed of a capacitor 41 and a resistor 42. An n-depletion MOSFET is provided as the self-conducting FET 12. If the resistor 8 is dimensioned at 30 Kohm, for instance, and the resistor 16 at 0.31 Kohm, with a capacitive load of 10 pF, the n-channel depletion MOSFET 12 draws approximately 1 mA in repose or rest condition and acts as a constant current source. If the capacitive load 4 is to be charged, this current rises to approximately 100 mA, since the potential at the connecting point of the resistors 8 and 16 rises as well, because the bipolar transistor 21a is switched off. The overall result of this circuit configuration according to the invention is a reduction in the rise time of the bipolar transistor 21a and therefore accelerated recharging of the capacitive load 4.

Figure 5:
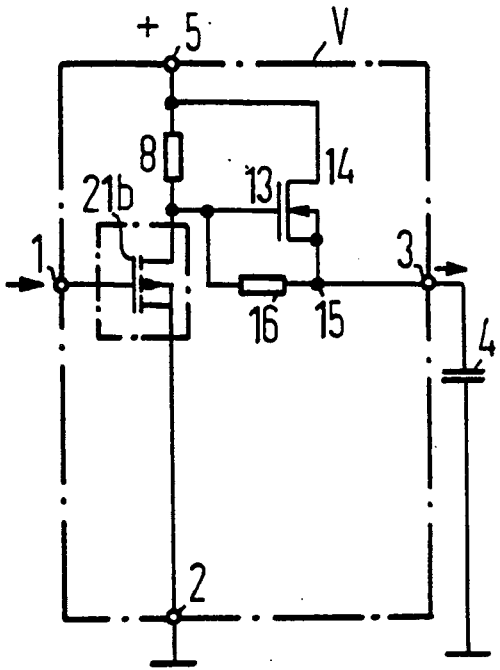
FIG. 5 is a circuit diagram of a configuration of an amplifier stage with an enhancement MOSFET according to the invention.

FIG. 5 shows a circuit configuration according to the invention with a p-channel enhancement MOSFET 21b. The gate lead of the p-channel enhancement MOSFET 21b is connected to the input terminal 1, and its drain lead is connected to the connecting point of the resistors 8 and 16. The source lead of this MOSFET 21b is in direct contact with the reference potential terminal 2. However, in this case as well, it is possible to provide a current-dependent voltage feedback in the manner of the voltage feedback shown in FIG. 4.

Figure 6:
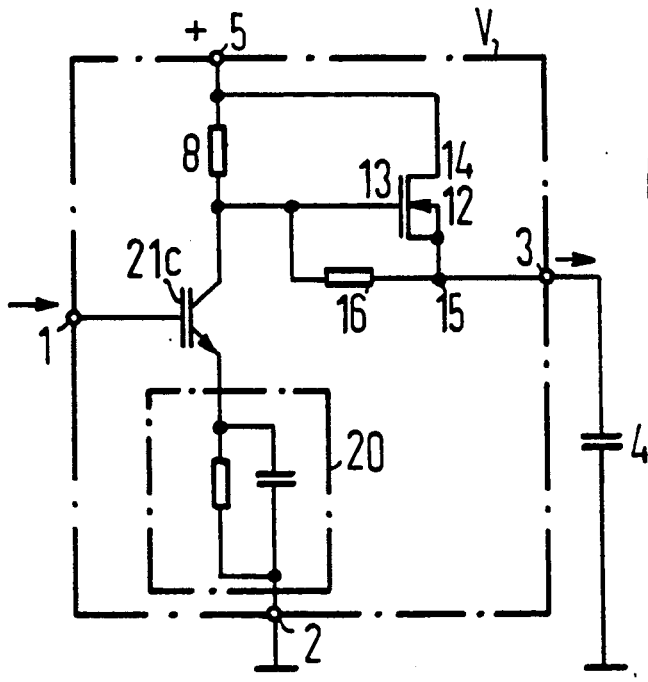
FIG. 6 is a circuit diagram of a configuration of an amplifier stage with an IGBT transistor according to the invention.

The circuit configuration shown in FIG. 6 differs from the circuit configurations shown in FIGS. 4 and 5 in that the amplifier quadrupole is replaced with a so-called IGBT 21c (insulated gate bipolar transistor) as is known, for example, from the publication Elektronik (Electronics), No. 9, 1987, pp. 120–124.

An accomplishment of the circuit configuration according to the invention is that the amount of amplification, with reference to amplification at 1 MHz, only drops by 3 dB at approximately 10 MHz. However, at that frequency, defined as a video bandwidth, the amplification still has 0.707 times the value of the amplification with input signals of 1 MHz. The circuit configuration according to the invention can therefore be preferentially used as a video end stage for triggering picture tubes, not only for those having a line frequency of 16 kHz but also for those having a line frequency of 32 kHz.

We claim:

1. Circuit configuration for an amplifier stage comprising:
   a) an input terminal for receiving an input signal;
   b) an output terminal to be connected to a capacitive load;
   c) a supply voltage terminal for connection to a direct voltage;
   d) at least one reference potential terminal to be connected to the capacitive load;
   e) an amplifier quadrupole for amplifying the input signal having a first output lead, a first input lead connected to said input terminal, a second input lead connected to said at least one reference potential terminal, and a second output lead connected to said at least one reference potential terminal;
   f) at least one self-conducting FET for accelerated charging of the capacitive load having a gate lead connected to said first output terminal, a drain lead connected to said supply voltage terminal, and a source lead connected to said output terminal;
   g) at least one ohmic resistor connected between said first output lead and said supply voltage terminal; and
   h) at least one other ohmic resistor connected between the gate lead and the source lead of said at least one self-conducting FET.

2. Circuit configuration according to claim 1, wherein said at least one self-conducting FET is a depletion MOSFET.

3. Circuit configuration according to claim 1, wherein said amplifier quadrupole has a current-dependent voltage feedback.

4. Circuit configuration according to claim 1, wherein said amplifier quadrupole has at least one amplifying transistor with a control path connected between said input leads and a load path connected between said output leads.

5. Circuit configuration according to claim 4, wherein said at least one amplifying transistor is a bipolar transistor.

6. Circuit configuration according to claim 4, wherein said at least one amplifying transistor is an enhancement MOSFET.

7. Circuit configuration according to claim 4, wherein said at least one amplifying transistor is an IGBT.

8. Circuit configuration according to claim 1, wherein the circuit configuration is a video amplifier end stage, and the capacitive load is a picture tube of the video amplifier end stage.

9. Circuit configuration according to claim 8, wherein a picture is triggerable with a video signal having a line frequency of 16 kHz.

10. Circuit configuration according to claim 8, wherein a picture is triggerable with a video signal having a line frequency of 32 kHz.

* * * * *